United States Patent
Major

(10) Patent No.: US 11,032,893 B2
(45) Date of Patent: Jun. 8, 2021

(54) HINGED REMOTE DRIVER BOX FOR LIGHT FIXTURE

(71) Applicant: ABL IP Holding LLC, Atlanta, GA (US)

(72) Inventor: Mark Charles Major, Lithonia, GA (US)

(73) Assignee: ABL IP Holding LLC, Atlanta, GA (US)

( * ) Notice: Subject to any disclaimer, the term of this patent is extended or adjusted under 35 U.S.C. 154(b) by 250 days.

(21) Appl. No.: 16/273,606

(22) Filed: Feb. 12, 2019

(65) Prior Publication Data

US 2020/0260541 A1    Aug. 13, 2020

(51) Int. Cl.
| H05B 47/185 | (2020.01) |
| H05K 5/02 | (2006.01) |
| F21V 23/00 | (2015.01) |

(52) U.S. Cl.
CPC ......... *H05B 47/185* (2020.01); *F21V 23/006* (2013.01); *F21V 23/008* (2013.01); *H05K 5/0226* (2013.01)

(58) Field of Classification Search
CPC .. H05B 47/185; H05K 5/0226; F21V 23/006; F21V 23/008
See application file for complete search history.

(56) References Cited

U.S. PATENT DOCUMENTS

| 4,220,986 A | 9/1980 | Matteo et al. |
| 4,796,001 A | 1/1989 | Gostyla |
| 5,416,680 A | 5/1995 | Holmes et al. |
| 5,720,540 A | 2/1998 | Crown et al. |
| 5,803,590 A | 9/1998 | Wedell et al. |
| 5,941,632 A | 8/1999 | Wedell et al. |
| 6,010,227 A | 1/2000 | Crown et al. |
| 6,059,427 A | 5/2000 | Wedell et al. |
| 6,132,065 A | 10/2000 | Wedell et al. |
| 6,241,367 B1 | 6/2001 | Wedell et al. |
| 6,302,564 B1 | 10/2001 | Wedell et al. |
| 6,419,378 B1 | 7/2002 | Wedell et al. |
| 6,481,867 B2 | 11/2002 | Ewing |
| RE38,767 E | 8/2005 | Wedell et al. |
| 7,014,339 B2 | 3/2006 | Sears, Jr. et al. |
| 7,210,826 B2 | 5/2007 | Haugaard et al. |
| 7,430,120 B2 | 9/2008 | Lau |
| 8,092,049 B2 | 1/2012 | Kinnune et al. |
| 8,313,222 B2 | 11/2012 | Kinnune et al. |
| 8,360,620 B1 | 1/2013 | Rashidi |
| 8,622,584 B2 | 1/2014 | Kinnune et al. |
| 9,039,241 B2 | 5/2015 | Kinnune et al. |

(Continued)

*Primary Examiner* — Thomas M Sember
(74) *Attorney, Agent, or Firm* — Kilpatrick Townsend & Stockton LLP

(57) ABSTRACT

A driver box for a light fixture includes a first compartment and a second compartment. The first compartment defines a first end of the driver box, and the second compartment defines a second end of the driver box opposite from the first end. The first compartment is pivotable relative to the second compartment. A method of installing a light fixture assembly includes pivoting the first compartment of the driver box relative to the second compartment of the driver box to a first orientation such that the driver box is insertable into an installation opening. The method includes inserting the driver box into the installation opening.

8 Claims, 6 Drawing Sheets

(56) References Cited

U.S. PATENT DOCUMENTS

| | | |
|---|---|---|
| 9,261,271 B2 | 2/2016 | Kinnune et al. |
| 9,534,775 B2 | 1/2017 | Wilcox et al. |
| 2014/0063776 A1 | 3/2014 | Clark et al. |
| 2015/0078012 A1 | 3/2015 | Delano |
| 2017/0307197 A1 | 10/2017 | Clark et al. |
| 2017/0363261 A1* | 12/2017 | White ................ F21V 23/06 |
| 2018/0180233 A1 | 6/2018 | Mellor et al. |

* cited by examiner

HINGED REMOTE DRIVER BOX FOR LIGHT FIXTURE

FIELD OF THE INVENTION

This application relates to remote driver boxes for light fixtures, and more particularly to hinged remote driver boxes for light fixtures.

BACKGROUND

Standard splice or remote junction boxes typically have a single housing that is segmented to contain both driver and wire-splice compartments, or a single compartment is provided to accommodate wire connections. Traditional remote junction boxes are limited because they are generally restricted by the size of the hole or opening in an installation wall, such as a ceiling, as well as the depth of the ceiling plenum. Due to the size restrictions, it is often difficult to install remote junction boxes for larger electronic enclosures in smaller and tighter spaces. Therefore, there is a need for a remote junction box that can provide for easy installation of larger electronic enclosures in smaller spaces.

SUMMARY

The terms "invention," "the invention," "this invention" and "the present invention" used in this patent are intended to refer broadly to all of the subject matter of this patent and the patent claims below. Statements containing these terms should be understood not to limit the subject matter described herein or to limit the meaning or scope of the patent claims below. Embodiments of the invention covered by this patent are defined by the claims below, not this summary. This summary is a high-level overview of various embodiments of the invention and introduces some of the concepts that are further described in the Detailed Description section below. This summary is not intended to identify key or essential features of the claimed subject matter, nor is it intended to be used in isolation to determine the scope of the claimed subject matter. The subject matter should be understood by reference to appropriate portions of the entire specification of this patent, any or all drawings, and each claim.

According to some examples, a driver box for a light fixture includes a first compartment defining a first end of the driver box and a second compartment defining a second end of the driver box that is opposite from the first end. The first compartment s pivotable relative to the second compartment.

In various cases, a pivot axis of the driver box is between the first end and the second end. In certain aspects, the driver box includes a first compartment cover that removably covers an opening to the first compartment and a second compartment cover that removably covers an opening to the second compartment. According to various examples, the driver box includes an articulating hinge connecting the first compartment with the second compartment, and the first compartment is pivotable relative to the second compartment through the articulating hinge.

In certain aspects, the first compartment is physically separated from the second compartment. In various cases, the first compartment is a driver compartment configured to accommodate a driver of a light fixture, and the second compartment is a wiring compartment configured to accommodate wire connections. In various embodiments, the driver box includes an LED driver positioned within the driver compartment in some embodiments, the first compartment includes a first compartment axis, the second compartment includes a second compartment axis, and the first compartment is pivotable from a configuration where the first compartment axis is substantially parallel with the second compartment axis to a configuration where the first compartment axis is not parallel with the second compartment axis.

According to various examples, a light fixture assembly includes a light engine and a driver box remotely attached to the light engine. The driver box includes a first compartment and a second compartment, and the first compartment is pivotable relative to the second compartment.

In some embodiments, the driver box includes an articulating hinge between the first compartment and the second compartment, and the first compartment is pivotably connected to the second compartment through the articulating hinge. In certain examples, the first compartment includes a first compartment axis, the second compartment includes a second compartment axis, and the first compartment is pivotable from a configuration where the first compartment axis is substantially parallel with the second compartment axis to a configuration where the first compartment axis is not parallel with the second compartment axis.

In various embodiments, the first compartment is a driver compartment configured to accommodate a driver of the light fixture assembly, and the second compartment is a wiring compartment configured to accommodate wire connections. According to some examples, the light engine includes a plurality of LEDs, and the driver box further includes a LED driver within the first compartment. In certain aspects, the first compartment of the driver box is physically separated from the second compartment of the driver box.

According to certain examples, a method of installing a light fixture assembly includes pivoting a first compartment of a driver box relative to a second compartment of the driver box to a first orientation such that the driver box is insertable into an installation opening. The method includes inserting the driver box into the installation opening.

In certain embodiments, the first compartment is a driver compartment configured to accommodate a driver of the light fixture assembly, and the second compartment is a wiring compartment configured to accommodate wire connections. In various embodiments, the first compartment includes a first compartment axis, the second compartment includes a second compartment axis, and pivoting the first compartment relative to the second compartment includes pivoting the first compartment such that the first compartment axis is substantially parallel with the second compartment axis. In some examples, the first compartment includes a first compartment axis, the second compartment includes a second compartment axis, and pivoting the first compartment relative to the second compartment includes pivoting the first compartment such that the first compartment axis is not parallel with the second compartment axis. In some aspects, the method includes pivoting the first compartment relative to the second compartment to a second orientation after inserting the driver box within the installation opening, and the second orientation is different from the first orientation. In various cases, the method includes securing a light engine of the light fixture assembly relative to the installation opening.

Various implementations described in the present disclosure can include additional systems, methods, features, and advantages, which cannot necessarily be expressly disclosed herein but will be apparent to one of ordinary skill in the art upon examination of the following detailed description and accompanying drawings. It is intended that all such systems, methods, features, and advantages be included within the present disclosure and protected by the accompanying claims.

BRIEF DESCRIPTION OF THE DRAWINGS

The features and components of the following figures are illustrated to emphasize the general principles of the present disclosure. Corresponding features and components throughout the figures can be designated by matching reference characters for the sake of consistency and clarity.

DETAILED DESCRIPTION

Figure 1:
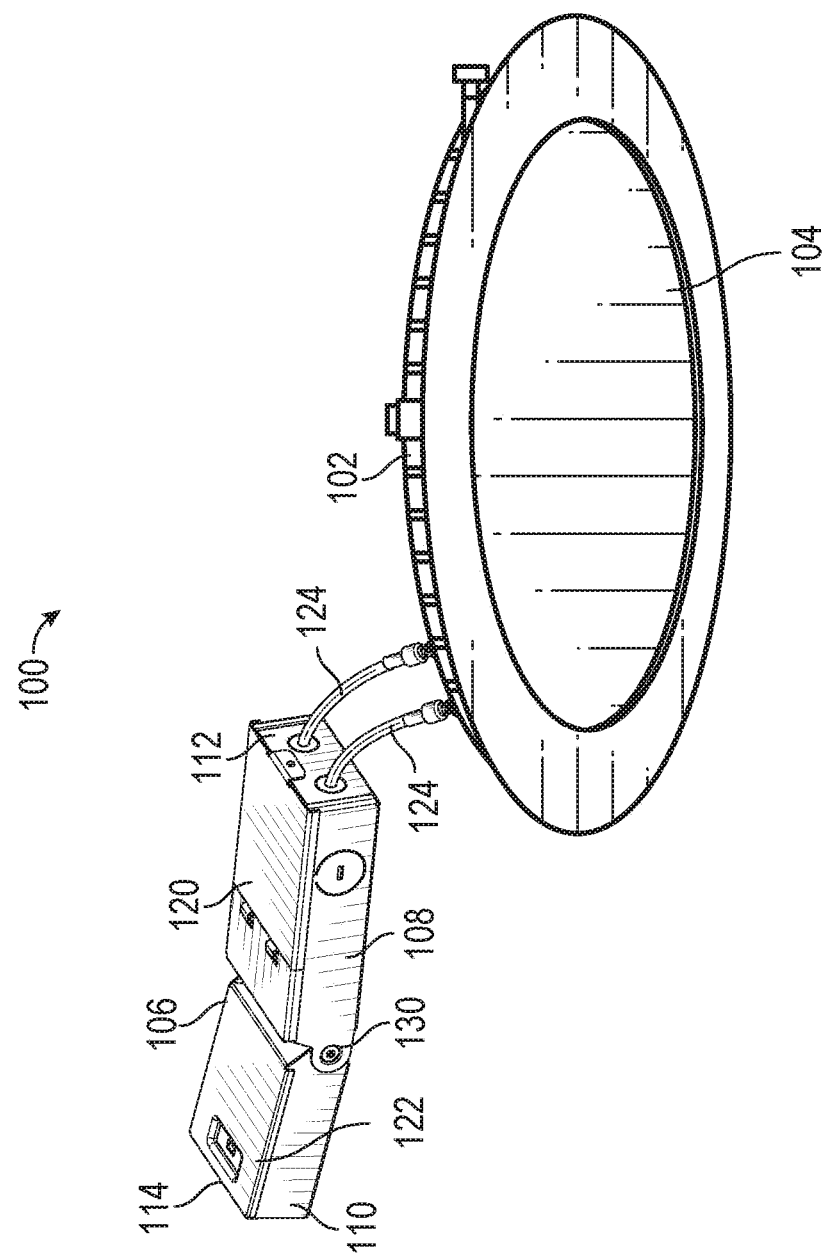
FIG. 1 illustrates a light fixture assembly that includes a remote driver box according to aspects of the current disclosure.
Figure 2:
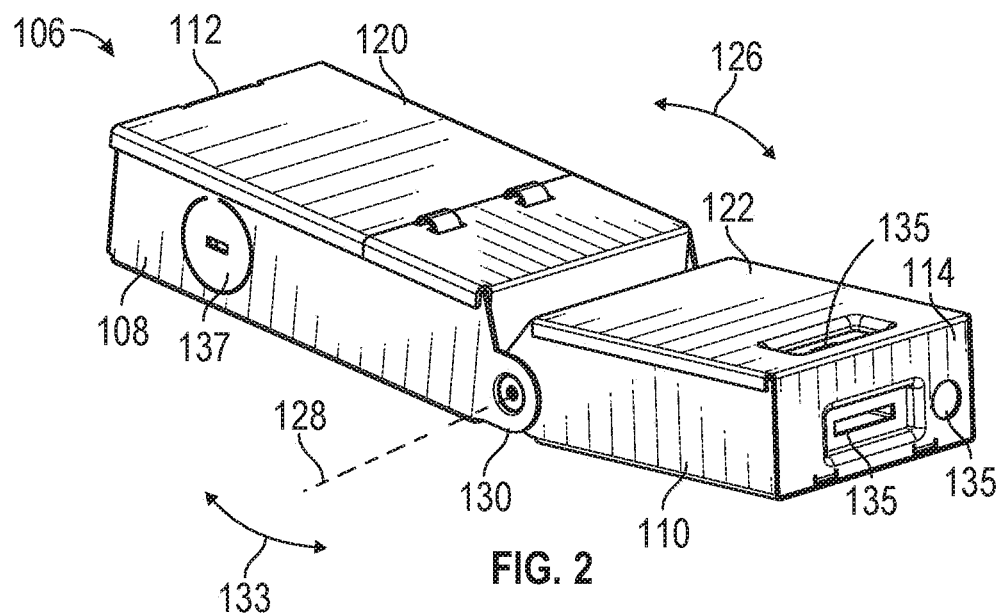
FIG. 2 is a perspective view of the remote driver box of FIG. 1.
Figure 3:
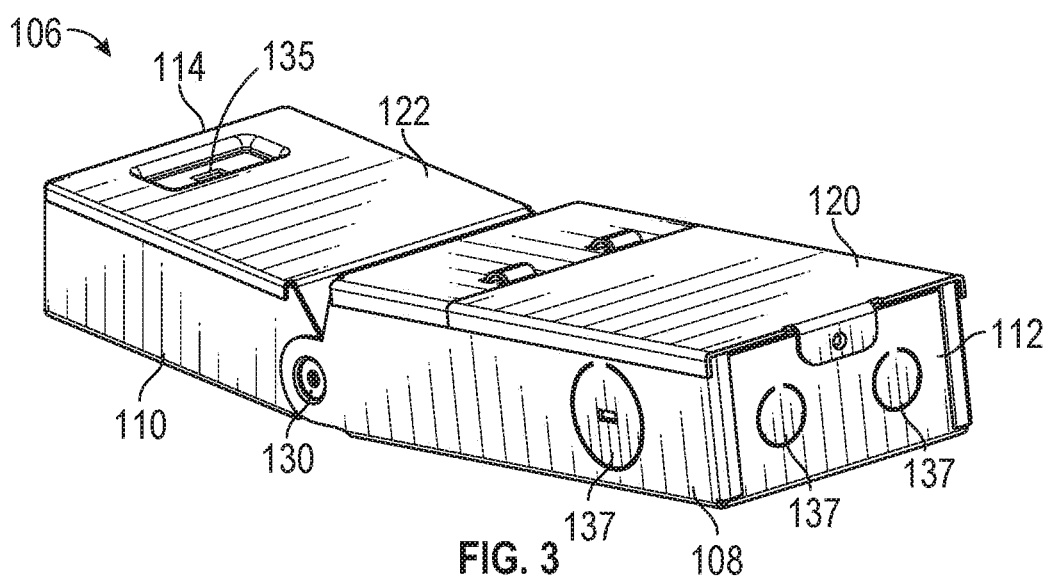
FIG. 3 is another perspective view of the remote driver box of FIG. 1.
Figure 4:
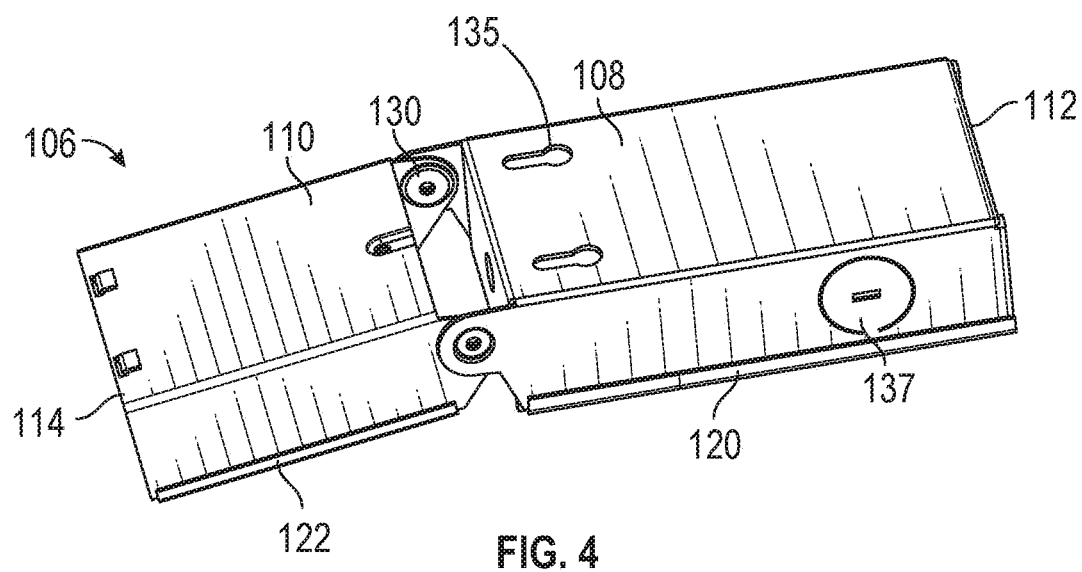
FIG. 4 is another perspective view of the remote driver box of FIG. 1.

The subject matter of embodiments of the present invention is described here with specificity to meet statutory requirements, but this description is not necessarily intended to limit the scope of the claims. The claimed subject matter may be embodied in other ways, may include different elements or steps, and may be used in conjunction with other existing or future technologies. This description should not be interpreted as implying any particular order or arrangement among or between various steps or elements except when the order of individual steps or arrangement of elements is explicitly described. Directional references such as u "down," "top," "left," "right," "front," and "back," among others are intended to refer to the orientation as illustrated and described in the figure or figures) to which the components and directions are referencing.

Embodiments of the present invention are directed to driver boxes for light fixtures, and particularly remote driver boxes for light fixtures. Embodiments of the present invention are directed to various ways by which to provide pivotable driver boxes with LED light fixtures, but it will be recognized that the invention may be embodied in light fixtures using other kinds of light sources, for example fluorescent, incandescent, halogen, etc. Embodiments of the present invention are not intended to be limited to the particulars of the light fixtures themselves.

Referring to FIGS. 1-8, a light fixture 100 generally includes a housing 102 with a light source, which may be a light engine with light emitting diodes (LEDs) 119 (see FIGS. 6-8) or other suitable light sources. When LEDs 119 are utilized, the LEDs may be various types of LEDs including single-die LEDs, multi-die LEDs, direct current (DC) LEDs, alternating current (AC) LEDs, organic light emitting diodes, and/or various other suitable LEDs. White, color, or multicolor LEDs may be used. Moreover, the LEDs need not all be the same color and/or type; rather, mixtures of different colors and/or types of LEDs may be used. The LEDs 119 are shown provided on printed circuit boards 121 (PCB). In the present example, a single PCB 121 is utilized. However, in other embodiments, no PCB is needed; rather, the LEDs 119 may be chip-on-board LEDs provided directly on the housing 102 or other structure of the light fixture 100. In further examples, any number of PCBs 121 may be utilized, including more than one PCB 121.

In some examples, the light fixture 100 further includes an optic 104 (such as a lens, diffuser, or other suitable optic) provided over the light source and positioned on the housing 102. The optic 104 may be positioned through various mechanisms such as via snap fitting onto a housing 102 or through various other suitable connection mechanisms to the housing 102 or other components of the light fixture 100. The optic 104 can be made of any non-metallic material that permits light to exit through the optic 104, including, but not limited to, polymeric materials, glass, silicone and various other suitable materials for light distribution.

It will be appreciated that the shape, configuration, and components of the light fixture 100 should not be considered limiting on the present disclosure as the light fixture 100 may have any desired shape or configuration with fewer or additional components. The light fixture 100 may commonly be mounted in or on a ceiling such that the light source faces downward into the space below, but this is not a requirement and the light fixture 100 may be installed in any orientation. As such, the specific light fixture 100 should not be considered limiting on the current disclosure.

In various examples, a driver box 106 is provided with the light fixture 100 so as to power the light sources. In some examples, the driver box 106 may be provided remotely from the housing 102, meaning that the driver box 106 is positionable relative to the housing 102 (i.e., the position or orientation of the driver box 106 relative to the housing 102 can be adjusted). In some cases, the driver box 106 is provided remote from the housing 102 to reduce a height clearance of the light fixture 100 and/or otherwise provide an assembly that can be installed in small spaces as desired, such as ceiling or wall spaces having a shallow depth. In other examples, the driver box 106 may be provided at various locations on the housing 102. In examples where the driver box 106 is remote to the light fixture 100, the driver box 106 may be connected to the light fixture through various suitable wired and/or wireless connections. In the example of FIG. 1, the driver box 106 is connected to the light fixture 100 through wired connections 124.

Figure 5:
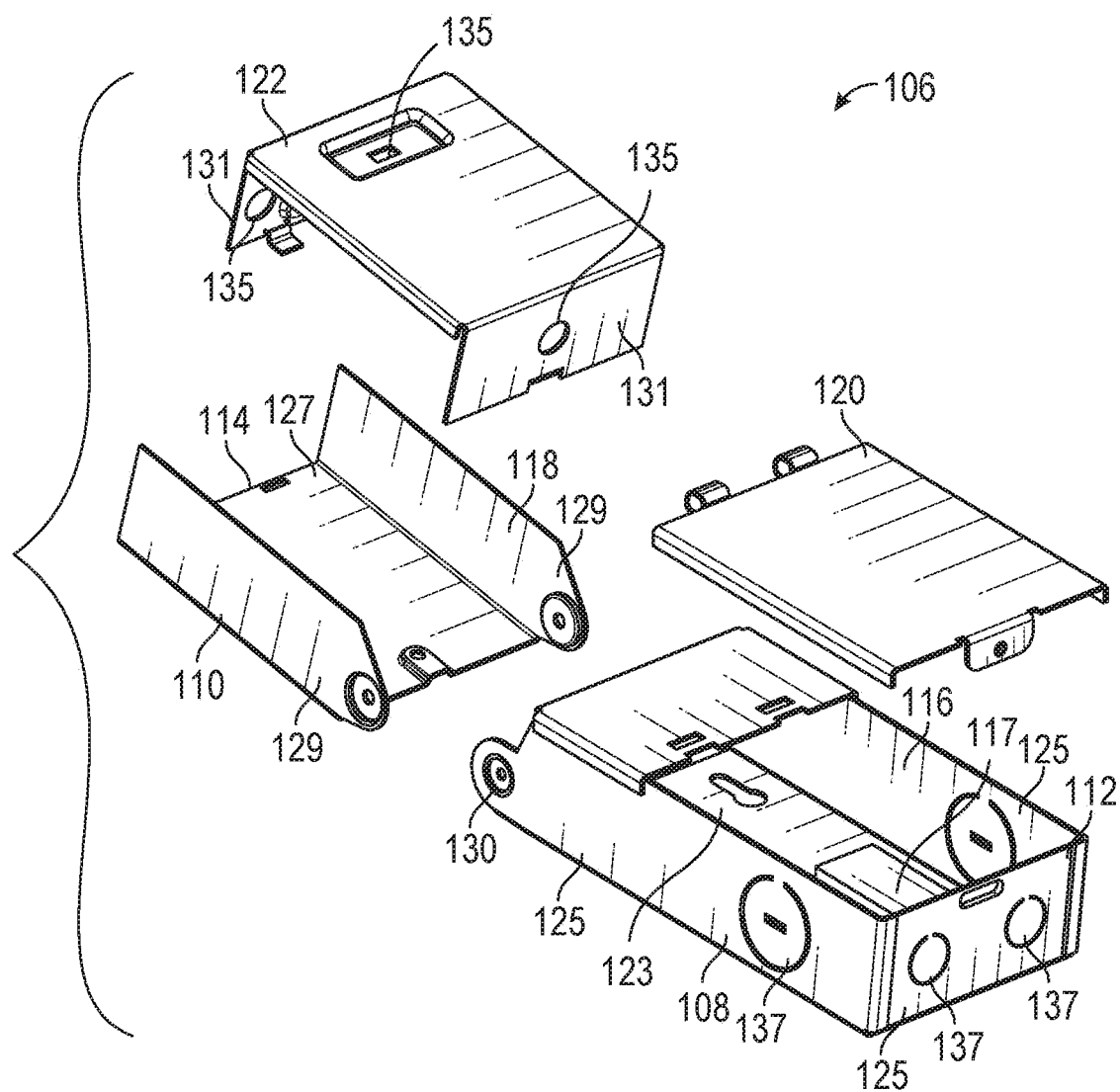
FIG. 5 is another perspective view of the remote driver box of FIG. 1 with compartment covers removed.

The driver box 106 includes a first compartment 108 and a second compartment 110. While two compartments 108, 110 are illustrated, in other examples, the driver box 106 may include more than two compartments, such as three compartments, four compartments, etc. As best illustrated in FIG. 5, in various examples, the first compartment 108 is formed by a bottom wall 123 and side walls 125. Similarly, the second compartment 110 is formed by a bottom wall 127 and side walls 129. In some embodiments, the first compartment 108 and the second compartment 110 are discrete compartments. An end of the bottom wall 123 of the first compartment 108 defines a first end 112 of the driver box 106, and an end of the bottom wall 127 of the second compartment 110 defines a second end 114 of the driver box 106. A length of the driver box 106 is a distance from the first end 112 to the second end 114. In some cases, the shape, size, and/or dimensions of the first compartment 108 may be the same as the shape, size, and/or dimensions of the second compartment 110, although they need not be in other examples. In some cases, the size of the compartment may depend on National Electrical Codes (NEC) standards related to the size of a compartment per number of connections, although it need not in other examples. In certain aspects, the shape, size, and dimensions of one compartment may be controlled independently from the shape, size, and dimensions of another compartment. As such, the shape, size, and dimensions of the first compartment 108 and second compartment 110 should not be considered limiting on the current disclosure.

In certain cases, a first compartment cover 120 encloses the first compartment chamber 116. Similarly, a second compartment cover 122 encloses the second compartment chamber 118. In various examples, the first compartment cover 120 and/or the second compartment cover 122 may be removably connected to the driver box 106 so as to permit access to the first compartment chamber 116 and/or second compartment chamber 118. Suitable mechanisms for removably connecting the covers 120, 122 to the driver box 106 include, but are not limited to, snap fit connections, hooks, pins, snaps, hinges, bolts, screws, clips, clasps, combinations thereof, and/or various other suitable mechanisms. Optionally, in some examples, and as illustrated in FIG. 5, the second compartment cover 122 may include sidewall extensions 131 that may at least partially define the second compartment 110. The first compartment cover 120 may also optionally include sidewall extensions. In other examples, all of the sidewalls of the driver box 106 may be integrally or monolithically formed with the bottom wall 123 and/or the bottom wall 127. Various openings 135 and/or punch-outs 137 may be provided in the first compartment 108, the first compartment cover 120, the second compartment 110, and/or the second compartment cover 122 to allow for various connections to the driver box 106 and components housed by the driver box 106.

As best illustrated in FIG. 5, the first compartment 108 defines a first compartment chamber 116 and the second compartment 110 defines a second compartment chamber 118. In various aspects, the first compartment chamber 116 is physically separated from the second compartment chamber 118 (such as by virtue of sidewalk 125, sidewalls 127, and/or sidewall extensions 131). Physically separating the first compartment chamber 116 from the second compartment chamber 118 may allow for a barrier between the two compartments, which may allow for the driver box 106 to comply with various NEC standards. For example, separating the chambers 116, 118 may provide a barrier between high and low voltage leads in the driver box 106. Optionally, if the first compartment chamber 116 is physically separated from the second compartment chamber 118, various wiring or other suitable components may communicatively or electrically (or as otherwise desired) connect the compartments 116, 118.

In some examples, the first compartment 108 is configured to accommodate a driver 117 (such as an LED driver) for the light fixture 100, and the second compartment is configured to accommodate various wire connections. In other examples, the first compartment 108 is configured to accommodate the wire connections and the second compartment is configured to accommodate the driver 117. In further examples, both compartments may accommodate wire connections for the light fixture 100. In other examples, one or both of the compartments 108, 110 may accommodate various other electronic components for the light fixture 100 as desired.

Figure 7:
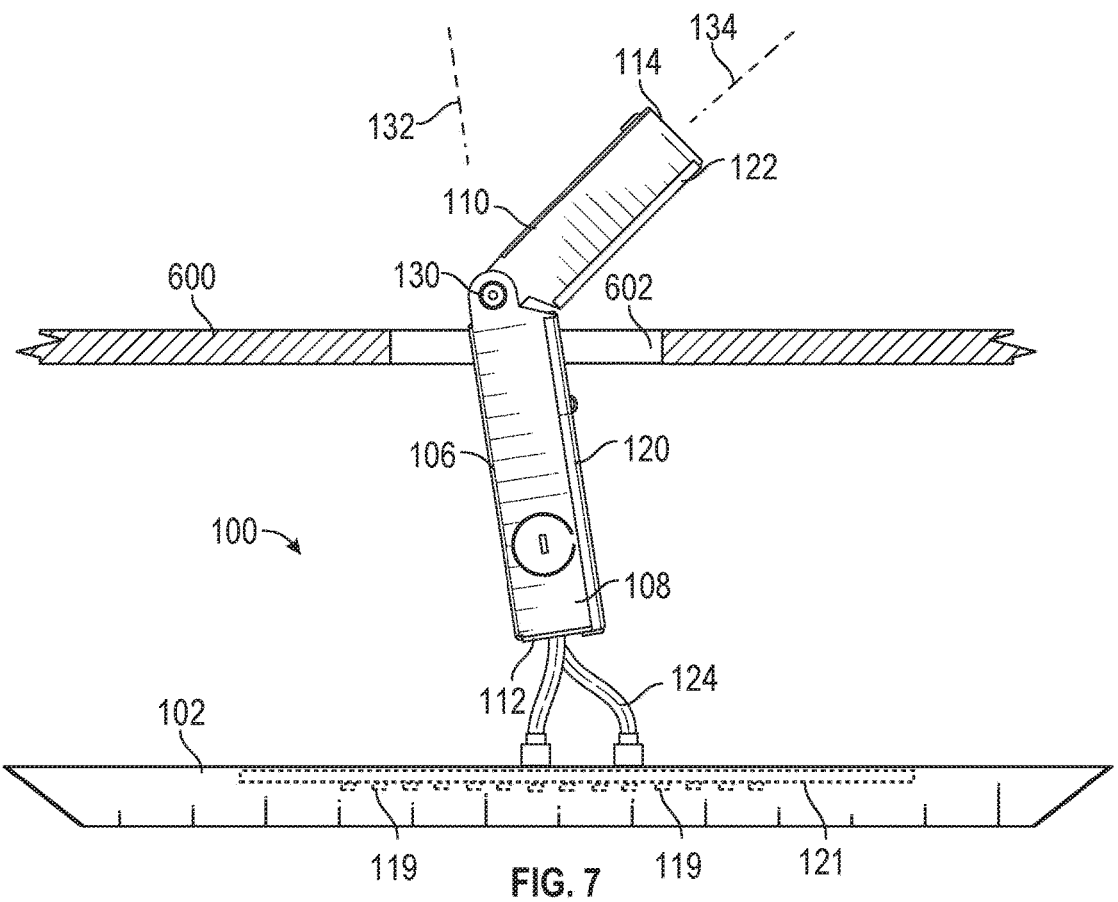
FIG. 7 illustrates the light fixture assembly of FIG. 1 during another installation step.
Figure 8:
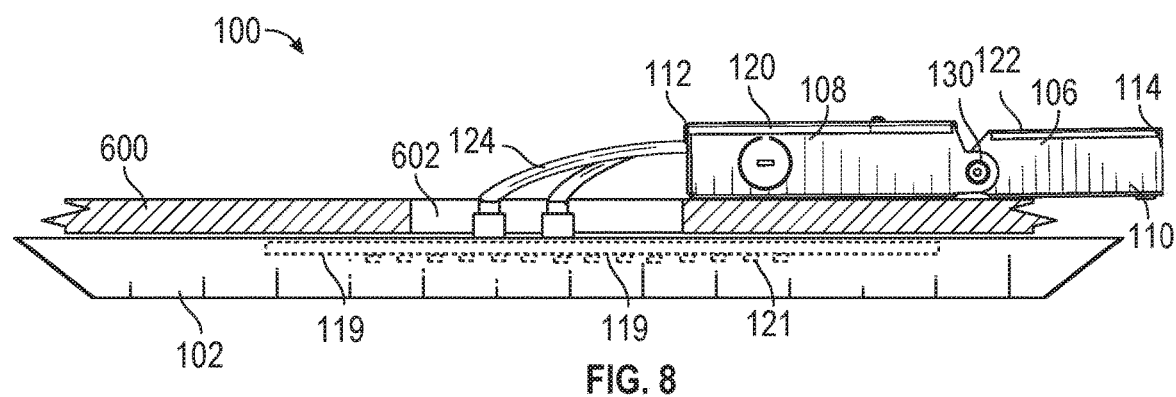
FIG. 8 illustrates the light fixture assembly of FIG. 1 during another installation step.

In various examples, the first compartment 108 is movably connected to the second compartment 110 through a hinge mechanism 130 such that an orientation of the first compartment 108 (and thus the first end 112) can be changed relative to the second compartment 110 (and thus the second end 114). In some examples, the hinge mechanism 130 allows for movement of the first compartment 108 relative to the second compartment 110 about a rotation axis 128. The first compartment 108 may move about the rotation axis 128 in a first direction represented by the arrow 126 in FIG. 2 and/or a second direction represented by the arrow 133. In other examples, the hinge mechanism 130 may allow for movement of the first compartment 108 relative to the second compartment 110 about a plurality of movement axes. In some examples, the first compartment 108 is movably connected to the second compartment 110 through various suitable movement mechanisms including, but not limited to, a hinge mechanism, rods, a flexible or bendable material, bearings, combinations thereof, and/or various other suitable movement mechanisms. As best illustrated in FIGS. 7 and 8, in certain cases, the first compartment 108 is movably connected to the second compartment 110 through the hinge mechanism such that an axis 132 of the first compartment 108 is substantially parallel to an axis 134 of the second compartment 110 (see FIG. 8) or the axis 132 is at a nonparallel angle relative to the axis 134 (see FIG. 7). In examples where more than two compartments are provided, the additional compartments may be movably connected to the first compartment 108 and/or the second compartment 110 through similar hinge mechanisms.

By movably connecting the first compartment 108 with the second compartment 110 through the hinge mechanism 130, the driver box 106 may both comply with NEC standards while also allowing for easier installation of larger electronic enclosures in smaller and tighter spaces. For example, in installation environments with small installation openings and/or a limited plenum depth, the first compartment 108 can be moved relative to the second compartment 110 to change its orientation and the overall geometry of the driver box 106 such that the driver box 106 can be inserted into the installation opening and/or housed in the ceiling or wall plenum. The first compartment 108 and the second compartment 110 also provide a driver box 106 that is modular and can accommodate different driver configurations based on installation settings, light fixture 100 requirements, etc. as desired or needed.

Figure 6:
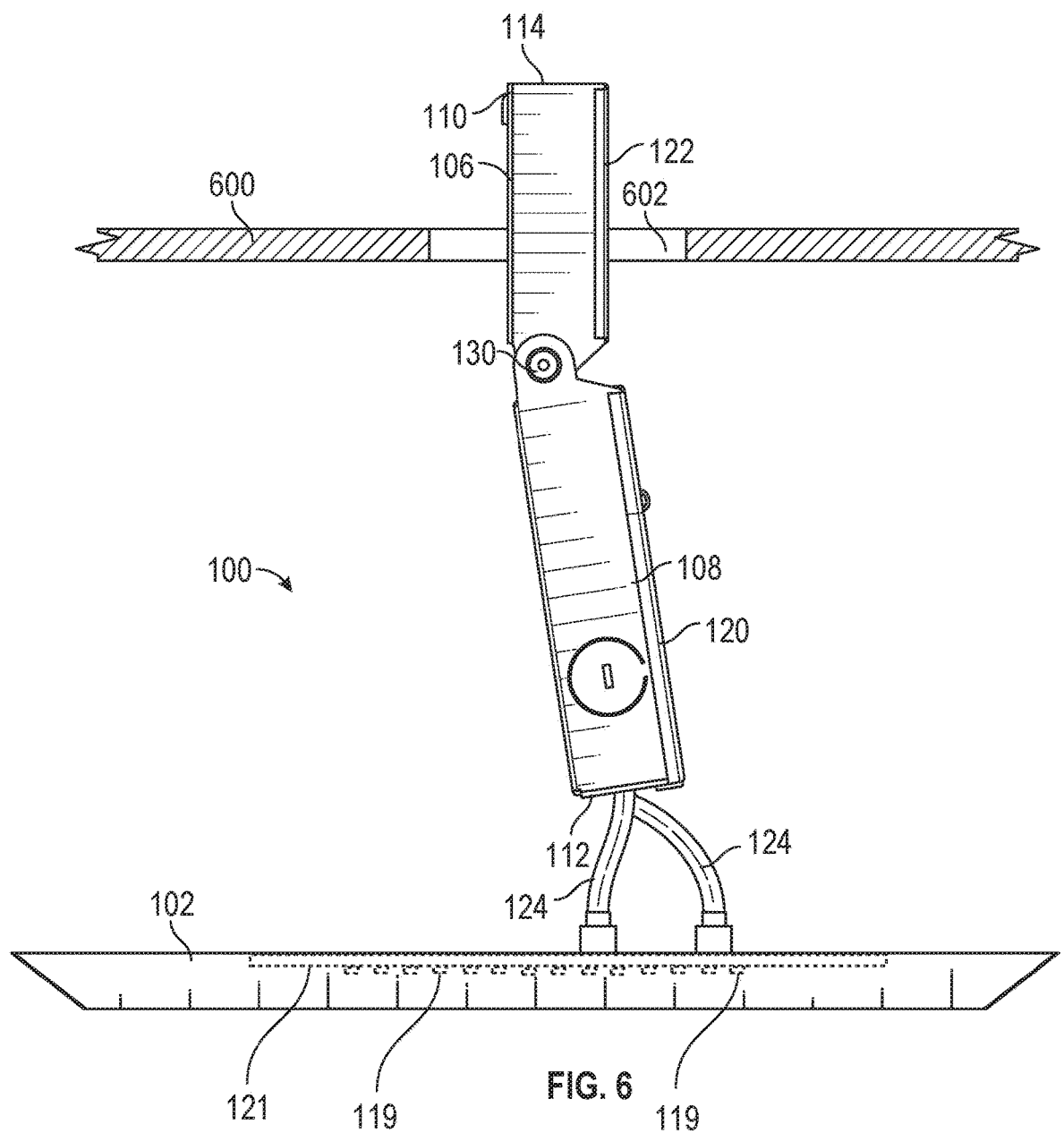
FIG. 6 illustrates the light fixture assembly of FIG. 1 during an installation step.

FIGS. 6-8 illustrate an example of installing the light fixture 100 having the driver box 106 into a ceiling 600 having a ceiling opening 602. As mentioned, in other examples, the light fixture 100 and driver box 106 may be installed at various other locations as desired.

The method includes moving the first compartment 108 of the driver box 106 relative to the second compartment 110 such that the driver box 106 can be inserted into the opening 602. Depending on the size of the opening 602 and the ceiling depth, among other factors, the first compartment 108 may be oriented relative to the second compartment 110 such that the axis 132 of the first compartment 108 is substantially parallel or is not parallel to the axis 134 of the second compartment 110. In some examples, the first compartment 108 may be pre-oriented relative to the second compartment 110 prior to insertion of a portion of the driver box 106 into the opening 602. In other examples, as illustrated in FIGS. 6 and 7, the orientation of the first compartment 108 relative to the second compartment 110 may be changed depending on how much of the driver box 106 is inserted through the opening 602. In other words, the first compartment 108 need not stay in the first orientation throughout the installation process.

After the driver box 106 is inserted through the opening 602, and depending on the ceiling depth, the first compartment 108 may optionally be moved relative to the second compartment 110 to another orientation that is different from the initial orientation. In other examples, the driver box 106 need not be further moved or changed after it is installed through the opening 602. In various examples, the light fixture is secured relative to the opening 602 after the driver box 106 is positioned.

The above-described aspects are merely possible examples of implementations, merely set forth for a clear understanding of the principles of the present disclosure. Many variations and modifications can be made to the above-described embodiment(s) without departing substantially from the spirit and principles of the present disclosure. All such modifications and variations are intended to be included herein within the scope of the present disclosure, and all possible claims to individual aspects or combinations of elements or steps are intended to be supported by the present disclosure. Moreover, although specific terms are employed herein, as well as in the claims that follow, they are used only in a generic and descriptive sense, and not for the purposes of limiting the described invention, nor the claims that follow.

That which is claimed:

1. A light fixture assembly comprising:
   a light engine; and
   a driver box remotely attached to the light engine and comprising a first compartment and a second compartment, wherein the first compartment is pivotable relative to the second compartment.

2. The light fixture assembly of claim 1, further comprising an articulating hinge between the first compartment and the second compartment, and wherein the first compartment is pivotably connected to the second compartment through the articulating hinge.

3. The light fixture assembly of claim 1, wherein the first compartment comprises a first compartment axis, wherein the second compartment comprises a second compartment axis, and wherein the first compartment is pivotable from a configuration where the first compartment axis is substantially parallel with the second compartment axis to a configuration where the first compartment axis is not parallel with the second compartment axis.

4. The light fixture assembly of claim 1, wherein the first compartment is a driver compartment configured to accommodate a driver for the light fixture assembly, and wherein the second compartment is a wiring compartment configured to accommodate wire connections.

5. The light fixture assembly of claim 4, wherein the light engine comprises a plurality of LEDs, and wherein the driver box further comprises a LED driver within the first compartment.

6. The light fixture assembly of claim 1, wherein the first compartment of the driver box is physically separated from the second compartment of the driver box.

7. The light fixture assembly of claim 1, wherein the first compartment define a first end of the driver box, wherein the second compartment defines a second end of the driver box that is opposite from the first end, and wherein a pivot axis of the driver box is between the first end and the second end.

8. The light fixture assembly of claim 1, wherein the driver box further comprises a first compartment cover that removably covers an opening to the first compartment and a second compartment cover that removably covers an opening to the second compartment.

\* \* \* \* \*